US009476940B2

(12) United States Patent
Zimmerman

(10) Patent No.: US 9,476,940 B2
(45) Date of Patent: *Oct. 25, 2016

(54) BOUNDARY SCAN CHAIN FOR STACKED MEMORY

(71) Applicant: Intel Corporation, Santa Clara, CA (US)

(72) Inventor: David J. Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,478

(22) Filed: Dec. 31, 2013

(65) Prior Publication Data

US 2014/0122952 A1    May 1, 2014

Related U.S. Application Data

(63) Continuation of application No. 13/340,470, filed on Dec. 29, 2011, now Pat. No. 8,645,777.

(51) Int. Cl.
*G11C 5/04*     (2006.01)
*G11C 29/32*    (2006.01)
(Continued)

(52) U.S. Cl.
CPC .... *G01R 31/3177* (2013.01); *G01R 31/318513* (2013.01); *G01R 31/318558* (2013.01); *G01R 31/318572* (2013.01); *G11C 29/32* (2013.01); (Continued)

(58) Field of Classification Search
CPC .............. G01R 31/318572; G01R 31/318541;
G01R 31/318555; G01R 31/318536; G01R 31/318544; G01R 31/3177; G01R 31/318513; G01R 31/318558; G01R 31/31715
USPC .................................................. 714/724, 727
See application file for complete search history.

(56) References Cited

U.S. PATENT DOCUMENTS 6,125,464 A * 9/2000 Jin ................................. 714/727
6,694,465 B1 * 2/2004 Whetsel ........................ 714/726
(Continued)

FOREIGN PATENT DOCUMENTS

JP    2005-283206    10/2005
JP    2006-058273    3/2006
(Continued)

OTHER PUBLICATIONS

Office Action dated Mar. 14, 2014, in Great Britain Patent Application No. 1222983.7, 2 pages.
(Continued)

*Primary Examiner* — James C Kerveros
(74) *Attorney, Agent, or Firm* — Blakely, Sokoloff, Taylor & Zafman LLP

(57) ABSTRACT

A boundary scan chain for stacked memory. An embodiment of a memory device includes a system element and a memory stack including one or more memory die layers, each memory die layer including input-output (I/O) cells and a boundary scan chain for the I/O cells. A boundary scan chain of a memory die layer includes a scan chain portion for each of the I/O cells, the scan chain portion for an I/O cell including a first scan logic multiplexer a scan logic latch, an input of the scan logic latch being coupled with an output of the first scan logic multiplexer, and a decoder to provide command signals to the boundary scan chain.

27 Claims, 9 Drawing Sheets

(51) Int. Cl.
*G01R 31/3185* (2006.01)
*G01R 31/3177* (2006.01)

(52) U.S. Cl.
CPC .......... *G11C 5/04* (2013.01); *H01L 2924/0002* (2013.01)

(56) References Cited

U.S. PATENT DOCUMENTS

| | | | |
|---|---|---|---|
| 7,352,169 B2* | 4/2008 | Abraham et al. | 324/762.02 |
| 7,739,567 B2 | 6/2010 | Vandivier et al. | |
| 8,136,003 B2 | 3/2012 | Swoboda | |
| 2004/0262731 A1 | 12/2004 | Zhang | |
| 2005/0216804 A1 | 9/2005 | Sunada | |
| 2005/0216814 A1 | 9/2005 | Thomas | |
| 2006/0048029 A1 | 3/2006 | Kobayashi | |
| 2006/0289981 A1 | 12/2006 | Nickerson et al. | |
| 2008/0104464 A1 | 5/2008 | Elliott | |
| 2008/0288839 A1* | 11/2008 | Talayssat et al. | 714/727 |
| 2010/0332177 A1 | 12/2010 | Wu et al. | |
| 2011/0001559 A1 | 1/2011 | Shin et al. | |
| 2011/0007588 A1 | 1/2011 | Li et al. | |
| 2011/0161748 A1 | 6/2011 | Casper et al. | |
| 2011/0194369 A1 | 8/2011 | Jeddeloh | |
| 2012/0272112 A1 | 10/2012 | Oh et al. | |

FOREIGN PATENT DOCUMENTS

| | | |
|---|---|---|
| JP | 2013-131282 | 7/2013 |
| KR | 10-2008-0015031 | 2/2008 |

OTHER PUBLICATIONS

Combined Search and Examination Report dated Mar. 22, 2013, in British Patent Application No. 1222983.7, 7 pages.
Deutsch et al., "DfT Architecture and ATPG for Interconnect Tests of JEDEC Wide-I/O Memory-on-Logic Die Stacks," 2012 IEEE International Test Conference (ITC 2012): Nov 5-8, 2012, USA, 10 pages, ISBN 978-1-4673-1594-4 (IEE A/N 13247596).
English translation of Notice of Preliminary Rejection dated Dec. 31, 2013, in Korean Patent Application No. 2012-0154908, 4 pages.
Notice of Rejection Reason dated Nov. 26, 2013 (+ English translation), in Japanese Patent Application No. 2012-279616, 4 pages.
Office Action mailed Jun. 10, 2013, in U.S. Appl. No. 13/340,470, 8 pages.
Office Action dated Mar. 12, 2015 (+ English translation), in Taiwan Patent Application No. 101147482, 16 pages.

\* cited by examiner

| VSS | VSS | VDD1 | VDD1 | VDD1 | RST0-n |
|---|---|---|---|---|---|
| VSS | VSS | DQ112a | DQ113a | DQ114a | DQ115a |
| DM14a | DQ118a | VSSQ | VSSQ | DQ117a | DQ116a |
| DAa | NC | DQS7_ca | DQS7_ta | DQ119a | DQ120a |
| DM15a | DQ123a | VDDQ | VDDQ | DQ122a | DQ121a |
| VDD2 | VDD2 | DQ124a | DQ125a | DQ126a | DQ127a |
| VDD2 | VDD2 | DQ108a | DQ109a | DQ110a | DQ111a |
| DM13a | DQ107a | VDDQ | VDDQ | DQ106a | DQ105a |
| DA(o)0a | NC | DQS6_ca | DQS6_ta | DQ103a | DQ104a |
| DM12a | DQ102a | VSSQ | VSSQ | DQ101a | DQ100a |
| VSS | VSS | DQ96a | DQ97a | DQ98a | DQ99a |
| VSS | VSS | DQ80a | DQ81a | DQ82a | DQ83a |
| DM10a | DQ86a | VSSQ | VSSQ | DQ85a | DQ84a |
| DA(0)1a | NC | DQS5_c | DQS5_t | DQ87a | DQ88a |
| DM11a | DQ91a | VDDQ | VDDQ | DQ90a | DQ89a |
| VDD2 | VDD2 | DQ92a | DQ93a | DQ94a | DQ95a |
| VDD2 | VDD2 | DQ76a | DQ77a | DQ78a | DQ79a |
| DM9a | DQ75a | VDDQ | VDDQ | DQ74a | DQ73a |
| DA(o)2a | NC | DQS4_ca | DQS4_ta | DQ71a | DQ72a |
| DM8a | DQ70a | VSSQ | VSSQ | DQ69a | DQ68a |
| VSS | VSS | DQ64a | DQ65a | DQ66a | DQ67a |
| VSS | VSS | DQ48a | DQ49a | DQ50a | DQ51a |
| DM6a | DQ54a | VSSQ | VSSQ | DQ53a | DQ52a |
| DA(o)3a | NC | DQS3_ca | DQS3_ta | DQ55a | DQ56a |
| DM7 | DQ59a | VDDQ | VDDQ | DQ58a | DQ57a |
| VDD2 | VDD2 | DQ60a | DQ61a | DQ62a | DQ63a |
| VDD2 | VDD2 | DQ44a | DQ45a | DQ46a | DQ47a |
| DM5a | DQ43a | VDDQ | VDDQ | DQ42a | DQ41a |
| DA(o)4a | NC | DQS2_ca | DQS2_ta | DQ39a | DQ40a |
| DM4a | DQ38a | VSSQ | VSSQ | DQ37a | DQ36a |
| VSS | VSS | DQ32a | DQ33a | DQ34a | DQ35a |
| VSS | VSS | DQ16a | DQ17a | DQ18a | DQ19a |
| DM2a | DQ22a | VSSQ | VSSQ | DQ21a | DQ20a |
| DA(o)5a | NC | DQS1_ca | DQS1_ta | DQ23a | DQ24a |
| DM3a | DQ27a | VDDQ | VDDQ | DQ26a | DQ25a |
| VDD2 | VDD2 | DQ28a | DQ29a | DQ30a | DQ31a |
| VDD2 | VDD2 | DQ12a | DQ13a | DQ14a | DQ15a |
| DM1a | DQ11a | VDDQ | VDDQ | DQ10a | DQ9a |
| DA(o)6a | NC | DQS0_ca | DQS0_ta | DQ7a | DQ8a |
| DM0a | DQ6a | VSSQ | VSSQ | DQ5a | DQ4a |
| VSS | VSS | DQ0a | DQ1a | DQ2a | DQ3a |
| VSS | VSS | SCKa | SDIa | SSH_na | SOE_na |
| TESTa | SDOa | CS3_na | CS2_na | CKE3a | CKE2a |
| VDD2 | VDD2 | CS0_na | CS1_na | CKE0a | CKE1a |
| CK_ta | CK_ca | RAS_na | CAS_na | WE_na | A16a |
| VSS | VSS | BA1a | BA0a | A15a | A14a |
| DA(o)7a | NC | A10a | A11a | A12a | A13a |
| VDD2 | VDD2 | A9a | A8a | A7a | A6a |
| A0a | A1a | A2a | A3a | A4a | A5a |
| VSS | VSS | VPIN | VDD1 | VDD1 | VDD1 |

SDI 300 → (top)
SDO 350 ← (bottom)

Boundary Scan Routing

FIG. 3

| Description | SSEN | CS_n | SOE_n | SSH_n | SDI | SDO | DQ | SCK |
|---|---|---|---|---|---|---|---|---|
| Serial scan in/out 405 | 1 | 0 | 0 | 0 | valid | valid | Z | Rising Edge |
| Serial scan in 410 | 1 | 0 | 1 | 0 | valid | Z | Z | Rising Edge |
| Parallel in 415 | 1 | 1 | 1 | 1 | X | Z | valid (in) | Rising Edge |
| Parallel output 420 | 1 | 0 | 1 | 1 | X | Z | valid (out) | X |
| NOP (DQx, SDO float) | 1 | 0 | 0 | 1 | X | Z | Z | X |
| NOP (DQx, SDO float) | 1 | 1 | 0 | X | X | Z | Z | X |
| NOP (DQx, SDO float) | 1 | 1 | 1 | 0 | X | Z | Z | X |
| Scan disabled 425 | 0 | valid | X | X | X | X | X | X |

BOUNDARY SCAN CHAIN FOR STACKED MEMORY

CROSS-REFERENCE TO RELATED APPLICATION

This application is a continuation of U.S. patent application Ser. No. 13/340,470 filed Dec. 29, 2011, now issued as U.S. Patent No. 8,645,777, which application is incorporated herein by reference in its entirety.

TECHNICAL FIELD

Embodiments of the invention generally relate to the field of electronic devices and, more particularly, to a boundary scan chain for stacked memory.

BACKGROUND

To provide more dense memory for computing operations, concepts involving memory devices (which may be referred to as 3D stacked memory, or stacked memory) having a plurality of closely coupled memory elements have been developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

Testing of stacked memory is particularly important because the cost of the manufacture each memory device is comparison with conventional single layer memory devices.

However, the testing of such a memory device may require significant cost. For example, the testing of I/O connections may require certain hardware be included in a stacked memory device, but the hardware use a great deal of the limited space of a complex memory device, thereby reducing space for memory and increasing costs of manufacture.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 illustrates an embodiment of scan chain routing in an embodiment of a boundary scan chain;

FIG. 4 is an illustration of command encoding in an embodiment of an apparatus or system including a boundary scan chain;

DETAILED DESCRIPTION

Figure 1:
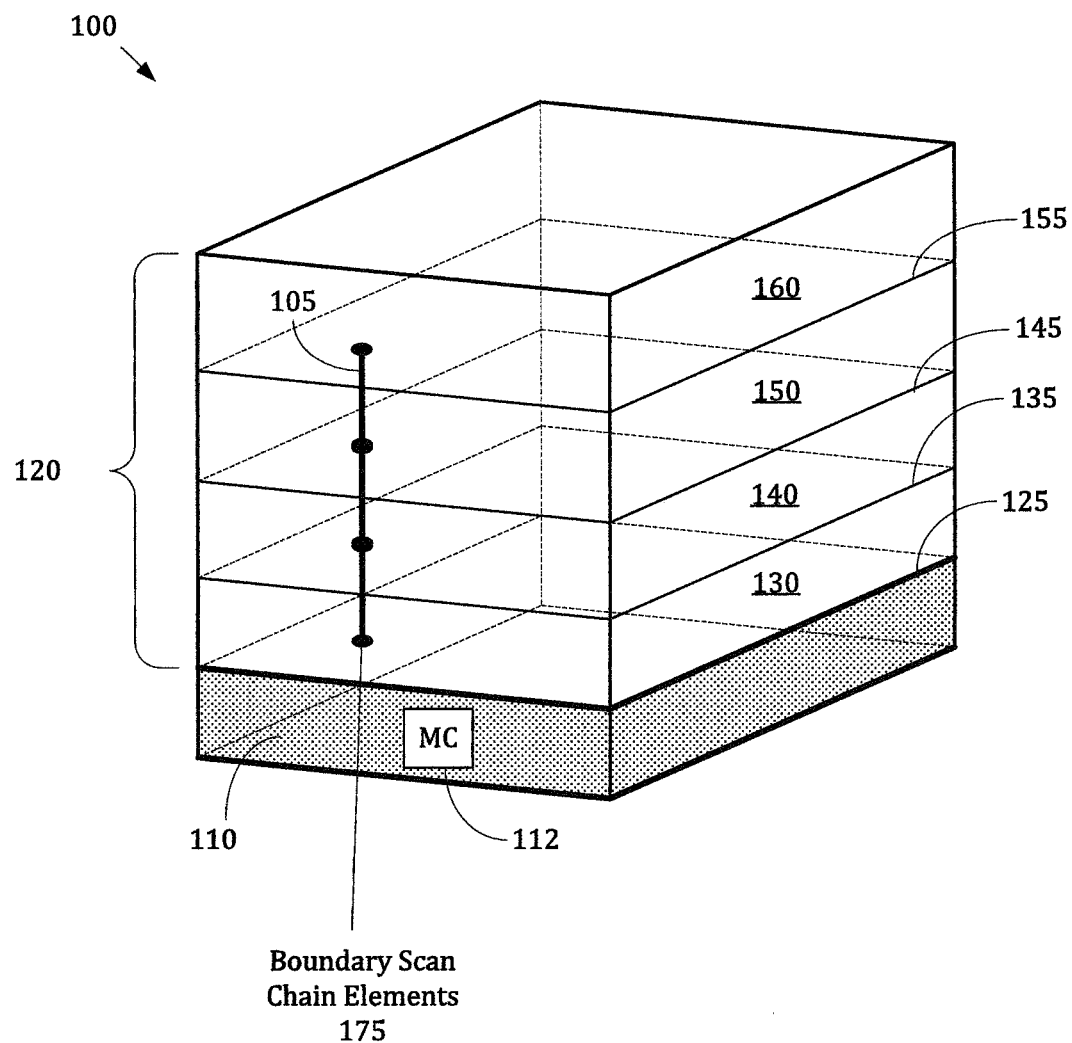
FIG. 1 illustrates an embodiment of a 3D stacked memory.

Embodiments of the invention are generally directed to a boundary scan chain for stacked memory.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a logic chip or a system on chip (SoC). A stacked memory device may include through silicon vias (TSVs) for providing interconnections between die layers. In some embodiments, the logic chip may be an application processor or graphics processing unit (GPU).

"Boundary scan chain" means a set of interconnected testing elements in an electronic device to allow for testing of interconnects.

In some embodiments, an apparatus, system, or process provide electrical access to IO on a stacked DRAM including TSVs. In some embodiments, a boundary scan chain is provided for testing of elements of a stacked memory. In some embodiments, the boundary scan chain allows serial and parallel input and output to and from IO cells, allowing verification of proper connectivity from die to die within a TSV-connected stack.

The utilization of through silicon vias (TSVs) in electronic devices is an emerging technology. Among the challenges to the design and manufacture of such devices is physical access to I/O cells. Conventional devices may address the need for access with scan chains that allow only serial output, or that require complex implementations. There are certain industry standards for interconnect tests (such as IEEE 1149.1 and IEEE 1500), but these standards are generally complex, and designed primarily for chip to chip interconnect on board test. In conventional devices and operations, a typical scan chain includes a command decoder, several registers, and a chain requiring two latches (flip-flop elements) per I/O cell. However, this requires a significant amount of hardware for the I/O connections of a stacked memory device.

In some embodiments, an apparatus, system, or method implements a "bare" or lightweight boundary scan chain in a stacked memory. In some embodiments, a scan chain includes a single latch per I/O cell. In some embodiments, the scan chain further utilizes reduced command decoding logic. An embodiment of the scan chain is well suited for implementation in a DRAM architecture, where logic gates require significant silicon area.

In some embodiments, a scan chain supports parallel output, rather than being limited to serial output. In some embodiments, the parallel output allows a die to die interconnect test within a memory stack, and from the memory stack to SoC or memory controller.

In some embodiments, a scan chain supports parallel input, rather than being limited to serial input. In some embodiments, the parallel input allows a die to die interconnect test within a memory stack, and from the memory stack to SoC or memory controller.

In some embodiments, a boundary scan chain may be used in multiple circumstances for testing of the stacked memory in manufacturer and for operation, such as testing on start up. In some embodiments, a boundary scan chain allows for testing and debugging of TSV connections at a memory supplier prior to attachment of the SoC or other logic element. In some embodiments, a boundary scan chain element may also be utilized after SOC attachment to verify proper connectivity and to isolate and diagnose failing connections.

FIG. 1 illustrates an embodiment of a 3D stacked memory. In this illustration, a 3D stacked memory device 100 includes a system element 110 (which may be referred to as a logic chip or controller die) coupled with one or more DRAM memory die layers 120, also referred to herein as the memory stack. In some embodiments, the system element may be a system on chip (SoC) or other similar element. The elements of this figure and the following figures are presented for illustration, and are not drawn to scale. While FIG. 1 illustrates an implementation in which the system element 110 is coupled below the memory stack of one or more memory die layers 120, embodiments are not limited to this arrangement. For example, in some embodiments a system element 110 may be located adjacent to the memory stack 120, and thus may be coupled in a side-by-side arrangement with the memory stack 120. Each die layer may include one or more slices or portions, and may have one or more different channels. Each die layer may include a temperature compensated self-refresh (TCSR) circuit to address thermal issues, where the TCSR and a mode register (MR) may be a part of management logic of the device, and where the MC may include thermal offset bit(s) for adjustment of refresh rate by the TCSR. The die layers and the system element may be thermally coupled together.

In this illustration, the DRAM memory die layers include four memory die layers, these layers being a first memory die layer 130, a second memory die layer 140, a third memory die layer 150, and a fourth memory die layer 160. However, embodiments are not limited to any particular number of memory die layers in the memory stack 120, and may include a greater or smaller number of memory die layers. Among other elements, the system element 110 may include a memory controller 112 for the memory stack 120. In some embodiments, each memory die layer (with the possible exception of the top, or outermost, memory die layer, such as the fourth memory die layer 160 in this illustration) includes a plurality of through silicon vias (TSVs) to provide paths through the silicon substrate of the memory die layers.

In some embodiments, each memory die layer includes an interface for a connection with another die layer or the system element 110. In this the first memory die layer 130 includes a first interface 125 for the coupling between the first memory die layer 130 and the system element 110; the second memory die layer 140 includes a second interface 135 for the coupling between the second memory die layer 140 and the first memory die layer 130; the third memory die layer 150 includes a third interface 145 for the coupling between the third memory die layer 150 and the second memory die layer 140; and the fourth memory die layer 160 includes a fourth interface 155 for the coupling between the fourth memory die layer 160 and the third memory die layer 150.

In some embodiments, the stacked memory device 100 includes a boundary scan chain 175 of each memory die layer to allow for testing of I/O cells of the memory device 100. In some embodiments, the boundary scan chain 175 may include the elements illustrated in FIG. 2, where the scan chain requires a single latch and one or two multiplexers for each I/O cell.

Figure 2:
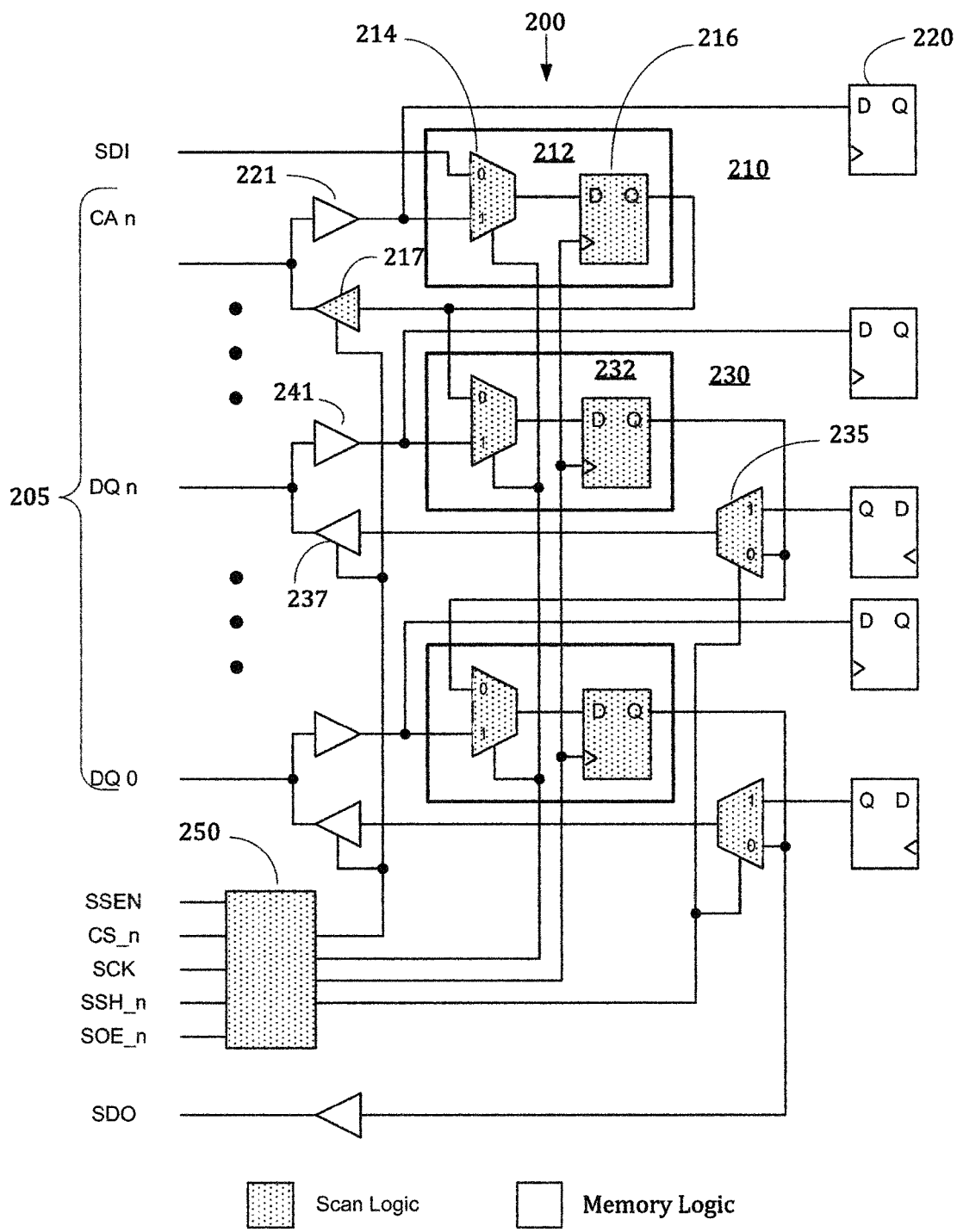
FIG. 2 illustrates an embodiment of a boundary scan chain for a memory device.

FIG. 2 illustrates an embodiment of a boundary scan chain for a memory device. In some embodiments, a scan chain 200 for a memory die provides for testing of a plurality of I/O cells 205. In this illustration, circuit elements illustrated are either memory logic elements (unshaded elements) for normal memory operation or scan logic elements (shaded elements) for the testing of the I/O cells. In some embodiments, each I/O cell includes a scan chain portion, the scan chain portion including an additional latch element (referred to as a scan logic latch) and one (for CA (Command Address bus) pins) or two (for DQ (Data) pins) 2-input multiplexers (referred to as first and second scan logic multiplexers).

In some embodiments, an output of a first scan logic multiplexer of a scan chain portion is coupled to an input of a scan logic latch of the scan chain portion. In some embodiments, a first input to the first scan logic multiplexer of the scan chain portion is coupled with a signal from the I/O driven by a first memory logic input driver and an input memory logic latch, and a second input is an output of a scan logic latch of a prior scan chain portion or (in the case of the first scan chain portion) a serial data input (SDI). An output of a last scan chain portion is coupled to a serial data output (SDO). The output of each CA portion scan logic latch is further coupled with a scan logic output driver to drive an output signal to the CA I/O cell. The output of each DQ portion scan logic latch is further coupled with a first input of a second scan logic multiplexer of the DQ portion. In some embodiments, the second scan logic multiplexer of each DQ scan chain portion has a second input coupled with a memory logic output latch for the DQ cell and an output coupled to a memory logic output driver to drive an output signal to the DQ cell. In some embodiments, the scan logic elements are further coupled with a scan logic decoder element. In some embodiments, the scan logic decoder may provide a signal to each I/O output, an enable signal to each first scan logic multiplexer, an enable signal to each second scan logic multiplexer, and a clock signal to each scan logic latch.

In some embodiments, the first and second scan logic multiplexers may select serial data or parallel data in, and select normal data or scan data out.

For example, a first scan chain portion 210 for I/O cell CAn includes a first scan circuit 212 including a first scan logic multiplexer 214 and a scan logic latch 216. The first scan chain portion 210 further includes a scan logic output driver 217 to drive signals into each CA I/O cell for scan testing, such as CAn in this example. Each CA I/O cell is also coupled with a memory logic input driver 221, while each DQ cell is coupled with a memory logic output driver 237 and a memory logic input driver 241. The output of the scan logic latch 216 is coupled with the input of the scan logic driver 217 and with a next scan logic portion, which is this is illustrated as scan chain portion 230 with scan circuit 232 and second scan logic multiplexer 235 for DQn. As illustrated, a scan logic decoder 250 is coupled with each scan logic output driver (such as 217) and each memory logic output driver (such as 237), with an enable pin of each first scan logic multiplexer (such as 214), with an enable pin of each second scan logic multiplexer (such as 235), and an clock pin of each scan logic latch (such as 216 and 232). The inputs to the decoder are SSEN (sensing signal), CS_n (chip select), SCK (scan clock), SSH_n (scan shift), and SOE_n (scan output enable).

In some embodiments, a boundary scan chain provides only a limited impact in operation. In some embodiments, the sole direct impact on normal signal operation is a multiplexer delay (via the second scan logic multiplexer, such as 235) in the DQ read path. In some embodiments, the CA pins are normally input-only, but for a scan operation a small driver (scan logic output driver, such as 217) is provided for parallel data out.

In some embodiments, the boundary scan chain is implemented in a Wide IO DRAM, which has 4 independent channels per die and up to 4 dies in a stack. In such implementation, the SSEN signal is common to all channels and die. Each channel has one copy of SCK, SSH, and SOE (scan output enable). Each channel also has a CS signal per die (up to 4 CS per channel or 16 per stack). CS is the only signal that is uniquely tied to a channel and a die. In some embodiments, the independent CS control is used during parallel read/write operations. In some embodiments, the signals are provided to the scan logic decode for the control of the scan logic and memory logic operation.

FIG. 3 illustrates an embodiment of scan chain routing in an embodiment of a boundary scan chain of a memory die. In some embodiments, the boundary scan chain is provided from a serial data in pin (SDI 300) to a serial data out pin (SDO 350).

In this example, the chain is routed so the first cell to exit the chain in serial operations is AO and the last is DQ112. In this implementation, the TSV connections for power, NC (no connect), DA (direct access), DA(o), TEST, CS_n, SSEN O, SSH_n, SDI, SCK, SDO, SOE_n, RST_n, and VPIN are excluded from the scan chain. In some embodiments, one or more unused address pins (which may be used for higher density memory, such as future higher density DRAM) are included in the routing of the scan chain.

FIG. 4 is an illustration of command encoding in an embodiment of an apparatus or system including a boundary scan chain. In some embodiments, the coding illustrated in FIG. 4 is provided to a decoder or similar element, such as scan logic decoder 250 illustrated in FIG. 2. In some embodiments, a serial scan in 405 or scan in/out 410 may be used to initialize the scan chain to known values; a scan out 415 may used to read the state of each node in the chain; and parallel input 420 may be used to capture the state on all pins at the same time, where parallel drive is used to drive out whatever information is loaded in the scan chain. Also illustrated is a scan disabled command coding 425 (SEN='0'). A scan is commonly a low speed capability used for DC connectivity testing. However, in some embodiments parallel operations on a stacked memory drive data on one die and to capture the data on another die with fairly accurate delays, thus allowing AC and speed related tests.

Figure 5:
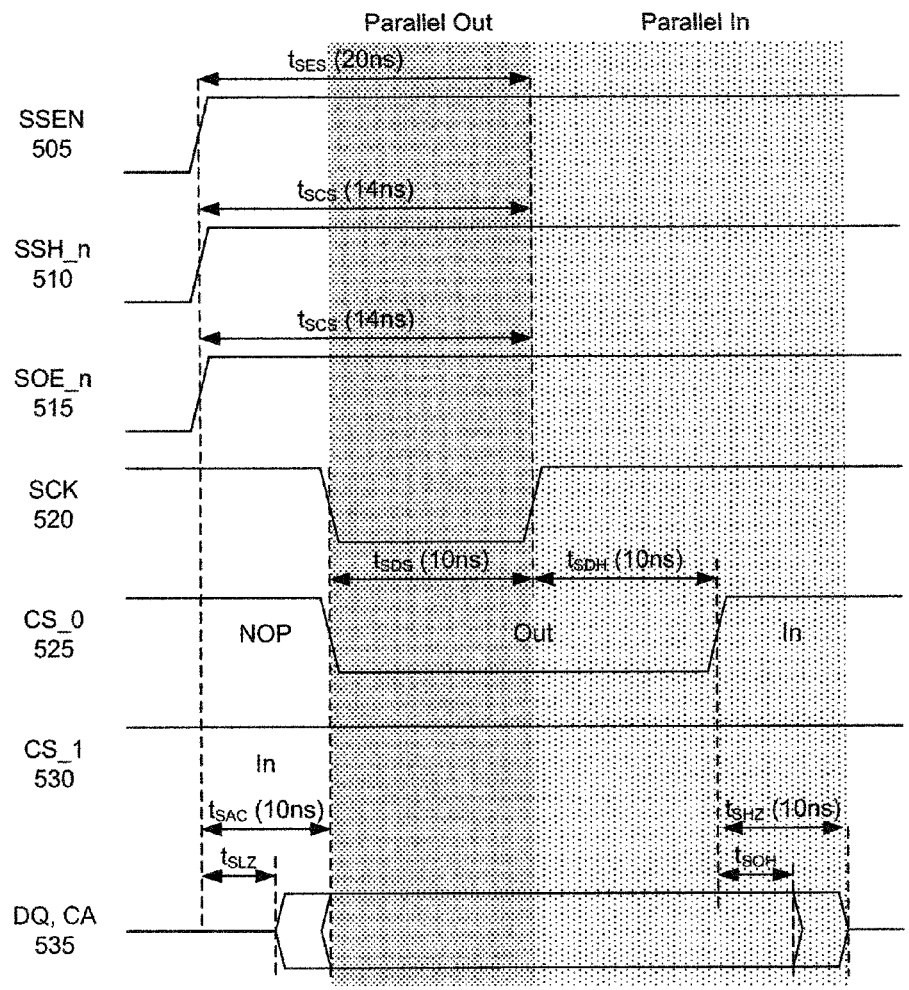
FIG. 5 is an illustration of a timing diagram for an embodiment of an apparatus or system including a boundary scan chain.

FIG. 5 is an illustration of a timing diagram for an embodiment of an apparatus or system including a boundary scan chain. In this illustration, signaling of SSEN 505, SSH_n 510, SOE_n 515, SCK 520, CS_0 525, CS_1 530, and DQ or CA 535 is illustrated for parallel data out and parallel data in periods.

Upon enabling SSEN 505 a sense period $t_{SES}$ is commenced, the period being 20 ns (nanoseconds) until the end of a parallel out sensing period. Upon enabling ('1') SOE_n (510) and SSH_n (515) and chip selection CS_0 transitioning to '0', the parallel out period commences. The parallel in period then commences when SCK='1' and ends when SSH_n transitions back to '0'.

Figure 6A:
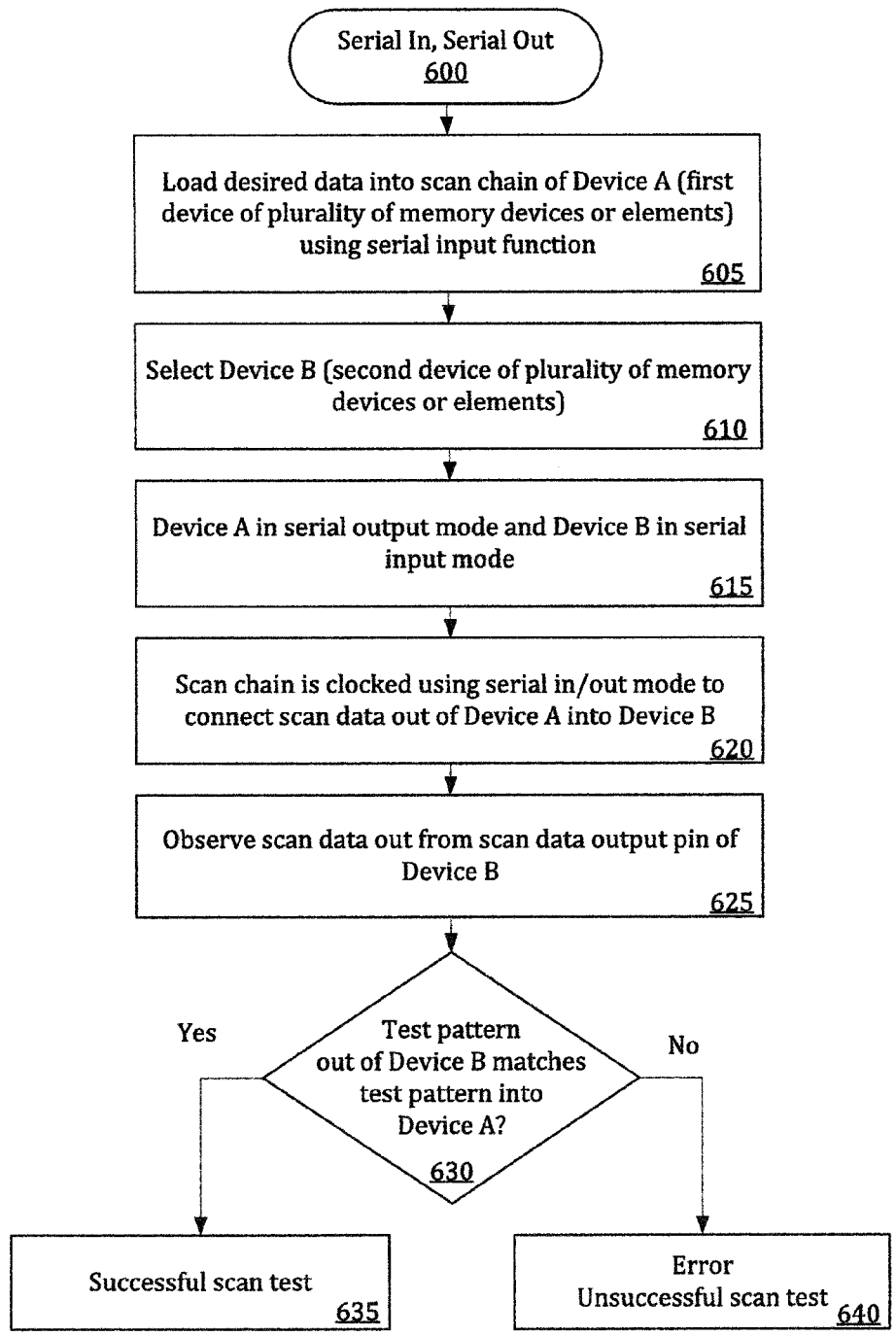
FIG. 6A is a flowchart to illustrate a process for a boundary scan of a stacked memory device including a serial in, serial out test process.

FIG. 6A is a flowchart to illustrate a process for a boundary scan of a stacked memory device including a serial in, serial out test process. In some embodiments, in a memory device including a memory stack having a plurality of memory devices (referring to any memory die layer or other memory element), a serial in, serial out scan chain operation 600 includes loading desired data into the scan chain of a first device (Device A) using a serial data input function 605, and selecting one of the other devices in the memory stack (Device B) 610. In some embodiments, Device A is placed in serial output mode and Device B is placed in serial input mode 615. In some embodiments, the scan chain is clocked using the serial data in/out mode to connect scan data out from device A and into device B 620. This operation transfers the data from device A to device B.

In some embodiments, data from the serial data output pin of device B is observed 625. The test pattern from the serial data output pin of Device B should be the same as the pattern clocked into Device A. In some embodiments, if the test pattern out from Device B matches the test pattern into Device A 630, the scan test is successful 635, and otherwise there is an error condition and the scan test is unsuccessful 640.

Figure 6B:
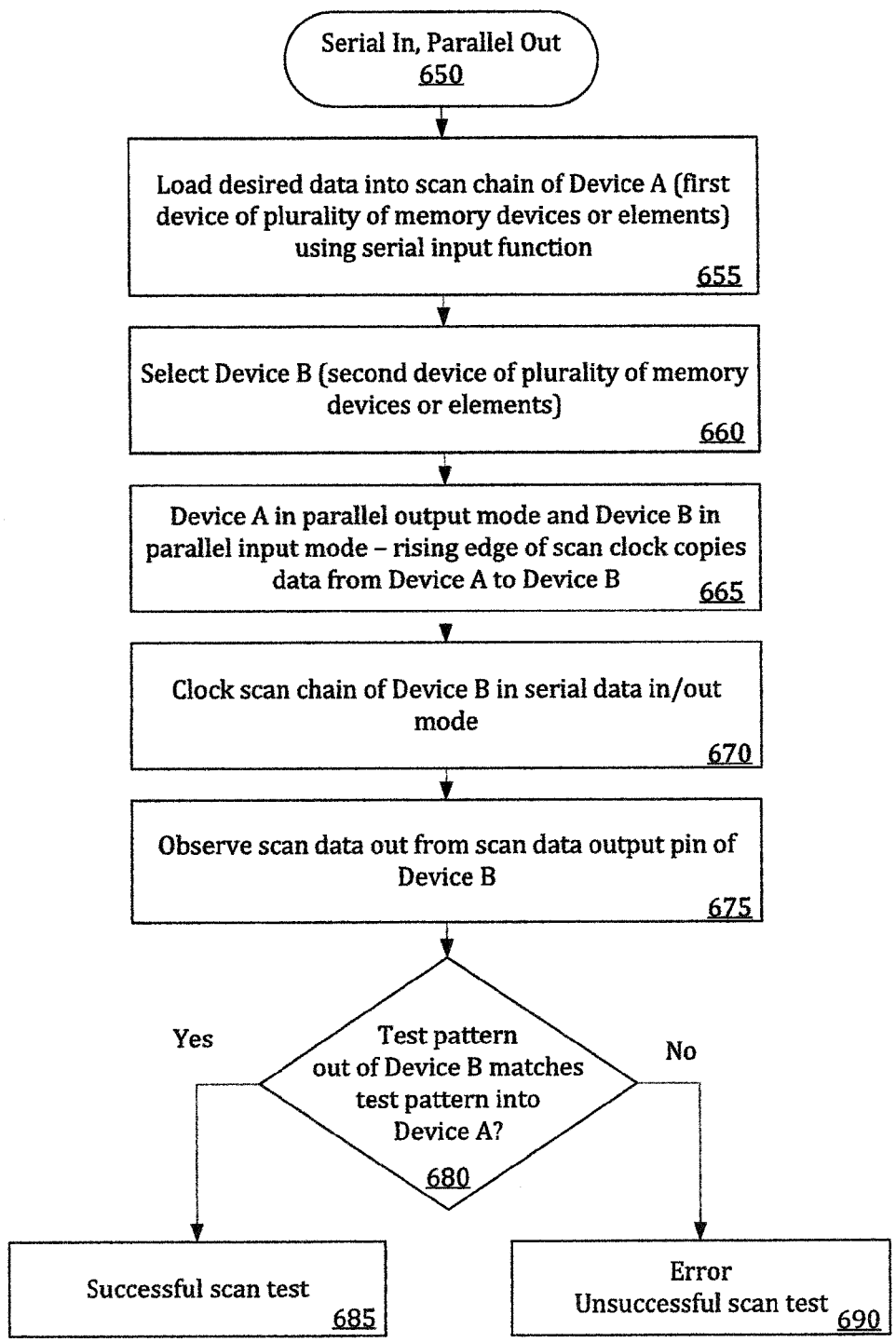
FIG. 6B is a flowchart to illustrate a process for a boundary scan of a stacked memory device including a serial in, parallel out test process.

FIG. 6B is a flowchart to illustrate a process for a boundary scan of a stacked memory device including a serial in, parallel out test process. In some embodiments, in a memory device including a memory stack having a plurality of memory devices, a serial in, parallel out scan chain operation 650 includes loading desired data into the scan chain of a first device (Device A) using a serial data input function 655, and selecting one of the other devices in the memory stack (Device B) 660. In some embodiments, Device A is placed in parallel output mode and Device B is placed in parallel input mode, where upon a rising edge (or falling edge in other implementations) of the scan clock the data is copied from Device A to Device B 665.

In some embodiments, the scan chain of Device B is clocked in serial data in/out mode 670, which provides for a serial output of the data received in parallel mode from Device A. In some embodiments, the data from the serial data output pin of Device B is observed 675. In some embodiments, if the test pattern out from Device B matches the test pattern into Device A 680, the test is successful 685, and otherwise there is an error condition 690.

Figure 7:
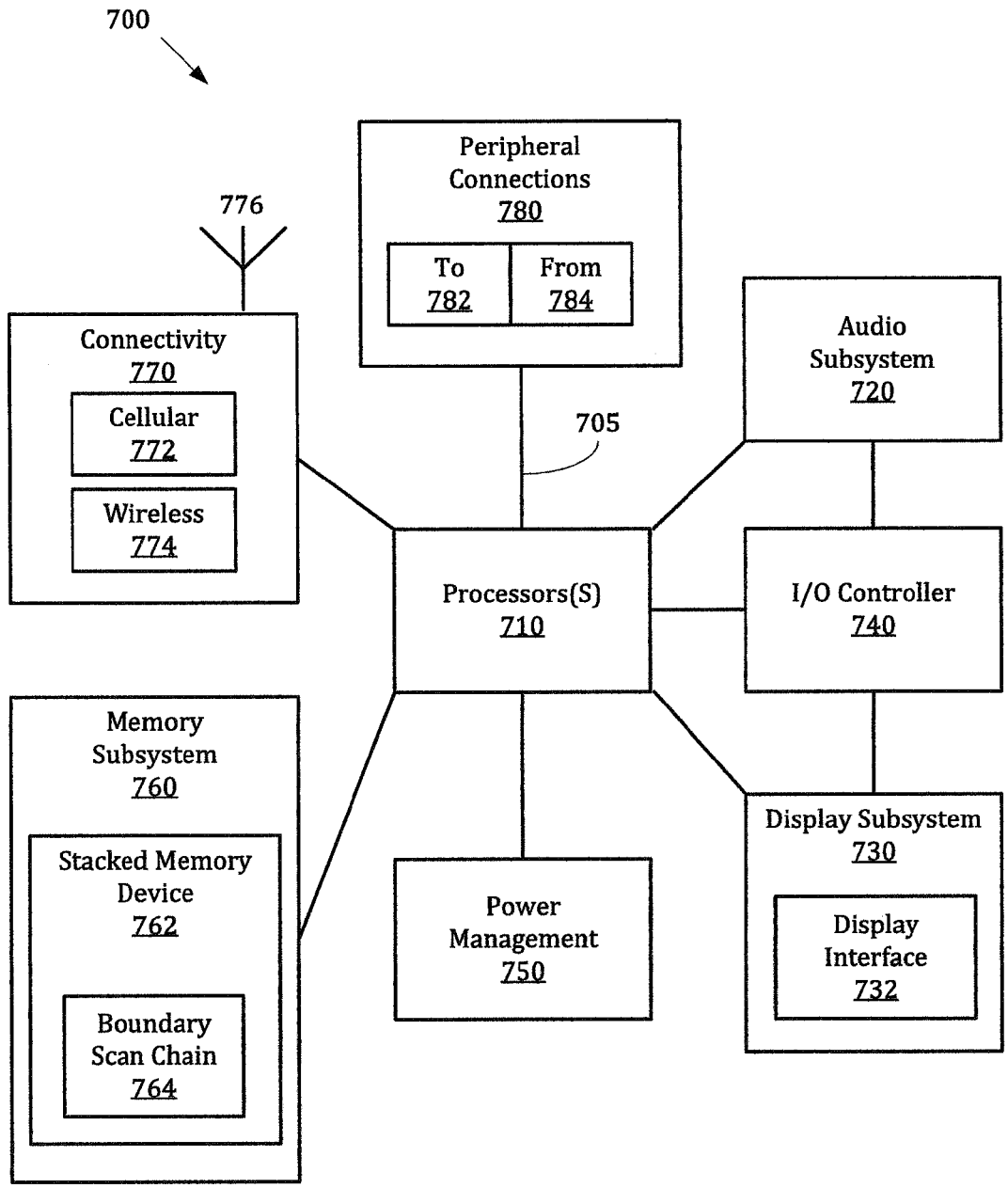
FIG. 7 is a block diagram to illustrate an embodiment of an apparatus or system including a stacked memory device.

A stacked memory may be utilized in many different computing environments, depending on the number of memory die layers in a memory device. FIG. 7 is a block diagram to illustrate an embodiment of an apparatus or system including a stacked memory device. Computing device 700 represents a computing device including a mobile computing device, such as a laptop or notebook computer, a netbook, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smartphone, a wireless-enabled e-reader, or other wireless mobile device. It will be understood that certain of the components are shown generally, and not all components of such a device are shown in device 600. The components may be connected by one or more buses or other connections 705.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications, device functions, or both are executed. The processing operations include operations related to I/O (input/output) with a human user or with other devices, operations related to power management, operations, or both related to connecting device 700 to another device. The processing operations may also include operations related to audio I/O, display I/O, or both.

In one embodiment, device 700 includes audio subsystem 720, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 700, or connected to device 700. In one embodiment, a user interacts with device 700 by providing audio commands that are received and processed by processor 710.

Display subsystem 730 represents hardware (such as display devices) and software (such as drivers) components that provide a display having visual, tactile, or both elements for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720, a display subsystem 730, or both such subsystems. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720, display subsystem 730, or both such subsystems. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation.

In some embodiments, memory subsystem 760 includes memory devices for storing information in device 700. The processor 710 may read and write data to elements of the memory subsystem 760. Memory can include nonvolatile (having a state that does not change if power to the memory device is interrupted), volatile (having a state that is indeterminate if power to the memory device is interrupted) memory devices, or both such memories. Memory 760 can store application data, user data, music, photos, documents, or other data, as well as system data (whether long-term or temporary) related to the execution of the applications and functions of system 700.

In some embodiments, the memory subsystem 760 may include a stacked memory device 762, where the stacked memory device includes one or more memory die layers and a system element. In some embodiments, each memory die layer or other memory element of the stacked memory device 762 includes a boundary scan chain 764, such as illustrated in FIG. 2, for the testing of I/O cells of the memory.

Connectivity 770 includes hardware devices (e.g., connectors and communication hardware for wireless communication, wired communication, or both) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as WiFi), wide area networks (such as WiMax), and other wireless communications. Connectivity may include one or more omnidirectional or directional antennas 776.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (such as downloading, uploading, changing, or synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 8:
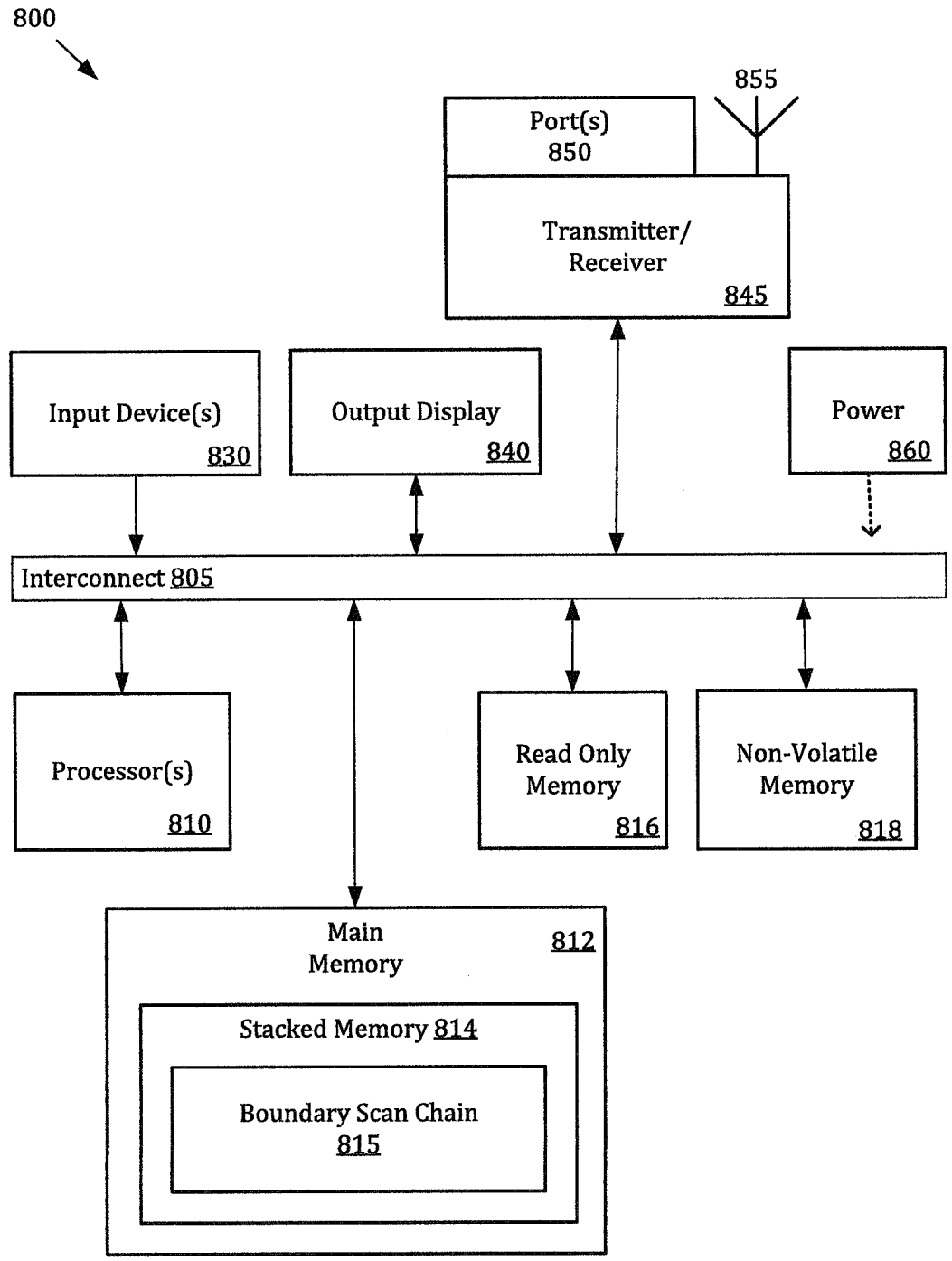
FIG. 8 illustrates an embodiment of a computing system including a boundary scan chain for testing of stacked memory.

FIG. 8 illustrates an embodiment of a computing system including a boundary scan chain for testing of stacked memory. The computing system may include a computer, server, game console, or other computing apparatus. In this illustration, certain standard and well-known components that are not germane to the present description are not shown. Under some embodiments, the computing system 800 comprises an interconnect or crossbar 805 or other communication means for transmission of data. The computing system 800 may include a processing means such as one or more processors 810 coupled with the interconnect 805 for processing information. The processors 810 may comprise one or more physical processors and one or more logical processors. The interconnect 805 is illustrated as a single interconnect for simplicity, but may represent multiple different interconnects or buses and the component connections to such interconnects may vary. The interconnect 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 812 for storing information and instructions to be executed by the processors 810. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 812 includes stacked memory 814, wherein each memory die layer or other memory element of the stacked memory device includes a boundary scan chain 815, such as illustrated in FIG. 2, for the testing of I/O cells of the memory.

The computing system 800 also may comprise a read only memory (ROM) 816 or other static storage device for storing static information and instructions for the processors 810. The computing system 800 may include one or more non-volatile memory elements 818 for the storage of certain elements.

In some embodiments, the computing system 800 includes one or more input devices 830, where the input devices include one or more of a keyboard, mouse, touch pad, voice command recognition, gesture recognition, or other device for providing an input to a computing system.

The computing system 800 may also be coupled via the interconnect 805 to an output display 840. In some embodiments, the display 840 may include a liquid crystal display (LCD) or any other display technology, for displaying information or content to a user. In some environments, the display 840 may include a touch-screen that is also utilized as at least a part of an input device. In some environments, the display 840 may be or may include an audio device, such as a speaker for providing audio information.

One or more transmitters or receivers 845 may also be coupled to the interconnect 805. In some embodiments, the computing system 800 may include one or more ports 850 for the reception or transmission of data. The computing system 800 may further include one or more omnidirectional or directional antennas 855 for the reception of data via radio signals.

The computing system 800 may also comprise a power device or system 860, which may comprise a power supply, a battery, a solar cell, a fuel cell, or other system or device for providing or generating power. The power provided by the power device or system 860 may be distributed as required to elements of the computing system 800.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
    a system element; and
    a memory stack including one or more memory die layers, each memory die layer including a plurality of input-output (I/O) cells, the plurality of I/O cells including first set of I/O cells and a second set of I/O cells, a first I/O cell of the first set of I/O cells being coupled with a last I/O cell of the second set of I/O cells, and a boundary scan chain for the I/O cells;
    wherein a boundary scan chain of a memory die layer to provide for serial and parallel input and output, the boundary scan chain including:
        a scan chain portion for each of the plurality of I/O cells, the scan chain portion for each I/O cell of the plurality of I/O cells including:
            a first scan logic multiplexer for each of the first set of I/O cells and each of the second set of I/O cells, and an additional second scan logic multiplexer for each of the second set of I/O cells, the first scan logic multiplexer for each I/O cell having a first input coupled with an input driver, and a second input from:
                a prior scan chain portion in the scan chain, wherein the second input for the first scan logic multiplexer of the last I/O cell of the second set of I/O cells is from the scan chain portion of the first I/O cell of the first set of I/O cells; or
                for a last I/O cell of the first set of I/O cells, a serial data input; and
            a single scan logic latch, wherein:
                an input of the scan logic latch is coupled with an output of the first scan logic multiplexer, and
                an output of the scan logic latch is coupled with an output driver for each of the first set of I/O cells, or is coupled with a first input of the second scan logic multiplexer for each of the second set of I/O cells, and
        a decoder to provide command signals to the scan chain.

2. The memory device of claim 1, wherein the output of the scan logic latch of each scan chain portion is further coupled with a next following scan chain portion in the scan chain or, for a scan chain portion of the first I/O cell of the second set of I/O cells, with a serial data output.

3. The memory device of claim 1, wherein the command signals provided by the decoder include an enable signal to the first scan logic multiplexer of each scan chain portion and a clock signal to the scan logic latch of each scan chain portion.

4. The memory device of claim 3, wherein the second scan logic multiplexer for each of the second set of I/O cells includes a second input from a memory output latch.

5. The memory device of claim 4, where the command signals provided by the decoder further include an enable signal to the second scan logic multiplexer for each of the second set of I/O cells.

6. The memory device of claim 1, wherein the output driver for the scan chain portion for each of the first set of I/O cells is to drive scan signals out to a command address bus cell.

7. The memory device of claim 1, wherein the memory stack includes a plurality of through silicon vias (TSVs) to carry signals through the memory device, the TSVs including connections for scan testing using the boundary scan chain of each memory die layer.

8. The memory device of claim 1, wherein the scan chain portions of the scan chain provide for serial and parallel testing of each memory die layer of the memory stack.

9. The memory device of claim 8, wherein the serial and parallel testing by the scan chain portions of the scan chain includes serial and parallel input to IO cells, and serial and parallel output from IO cells.

10. The memory device of claim 1, wherein a routing of a boundary scan chain of a memory die layer includes one or more unused address pins.

11. The memory device of claim 10, wherein the one or more unused pins are reserved for higher density memory dies.

12. The memory device of claim 1, wherein the first and second scan logic multiplexers of the scan chain are operable to select serial data input or parallel data input.

13. A method comprising:
    inputting a set of scan data to a first memory element of a plurality of memory elements of a memory stack, wherein each memory element includes a boundary scan chain for serial and parallel input and output, the scan chain including a scan chain portion for each of a plurality of I/O cells of the first memory element, the plurality of I/O cells including first set of I/O cells and a second set of I/O cells, a first I/O cell of the first set of I/O cells being coupled with a last I/O cell of the second set of I/O cells, the scan chain portion for each I/O cell of the plurality of I/O cells including:
        a first scan logic multiplexer for each of the first set of I/O cells and each of the second set of I/O cells, and an additional second scan logic multiplexer for each of the second set of I/O cells, the first scan logic multiplexer for each I/O cell having a first input coupled with an input driver, and a second input from:
            a prior scan chain portion in the scan chain, wherein the second input for the first scan logic multiplexer of the last I/O cell of the second set of I/O cells is from the scan chain portion of the first I/O cell of the first set of I/O cells; or for a last I/O cell of the first set of I/O cells, a serial data input, and a single scan logic latch, wherein:

an input of the scan logic latch is coupled with an output of the first scan logic multiplexer, and an output of the scan logic latch is coupled with an output driver for each of the first set of I/O cells, or is coupled with a first input of the second scan logic multiplexer for each of the second set of I/O cells;

transferring the scan data to a second memory element of the plurality of memory elements;

obtaining an output of scan data from the second memory element; and determining if the scan data input to the first memory element matches the scan data output from the second memory element, wherein a scan test is successful if the scan data input and the scan data output match.

14. The method of claim 13, wherein the scan data is input via a serial data input of the first memory element and is output from a serial data output of the second memory element.

15. The method of claim 14, wherein transferring the scan data from the first memory element to the second memory element includes putting the first memory element in a serial output mode and the second memory element in serial input mode.

16. The method of claim 14, wherein transferring the scan data from the first memory element to the second memory element includes putting the first memory element in a parallel output mode and the second memory element in a parallel input mode.

17. The method of claim 13, further selecting serial data input or parallel data input by setting the first and second scan logic multiplexers of the scan chain.

18. A system comprising:

a processor to process data for the system;

a transmitter to transmit data, a receiver to receive data, or both via an omnidirectional antenna; and a memory to store data for the system, the memory including a stacked memory, the stacked memory including a memory stack of one or more memory elements, wherein each memory element includes a boundary scan chain for a plurality of I/O cells of the memory element, the plurality of I/O cells including a first set of I/O cells and a second set of I/O cells, a first I/O cell of the first set of I/O cells being coupled with a last I/O cell of the second set of I/O cells;

wherein a boundary scan chain of a memory element to provide for serial and parallel input and output, the boundary scan chain including:

a scan chain portion for each of the plurality of I/O cells, the scan chain portion for each I/O cell of the plurality of I/O cells including:

a first scan logic multiplexer for each of the first set of I/O cells and each of the second set of I/O cells, and an additional second scan logic multiplexer for each of the second set of I/O cells, the first scan logic multiplexer for each I/O cell having a first input coupled with an input driver, and a second input from:

a prior scan chain portion in the scan chain, wherein the second input for the first scan logic multiplexer of the last I/O cell of the second set of I/O cells is from the scan chain portion of the first I/O cell of the first set of I/O cells; or for a last I/O cell of the first set of I/O cells, a serial data input; and a single scan logic latch, wherein:

an input of the scan logic latch is coupled with an output of the first scan logic multiplexer, and an output of the scan logic latch is coupled with an output driver for each of the first set of I/O cells, or is coupled with a first input of the second scan logic multiplexer for each of the second set of I/O cells, and a decoder to provide command signals to the scan chain.

19. The system of claim 18, wherein the output of the scan logic latch of each scan chain portion is further coupled with a next following scan chain portion in the scan chain or, for a scan chain portion of the first I/O cell of the second set of I/O cells, with a serial data output.

20. The system of claim 18, wherein the second scan logic multiplexer for each of the second set of I/O cells includes a second input from a memory output latch.

21. The system of claim 18, wherein the output driver for the scan chain portion for each of the first set of I/O cells is to drive scan signals out to a command address bus cell.

22. The system of claim 18, wherein the scan chain portions of the scan chain provide for serial and parallel testing of each memory die layer of the memory stack.

23. The system of claim 18, wherein the serial and parallel testing by the scan chain portions of the scan chain includes serial and parallel input to IO cells, and serial and parallel output from IO cells.

24. A non-transitory computer-readable storage medium having stored thereon data representing sequences of instructions that, when executed by a processor, cause the processor to perform operations comprising:

inputting a set of scan data to a first memory element of a plurality of memory elements of a memory stack, wherein each memory element includes a boundary scan chain for serial and parallel input and output, the scan chain including a scan chain portion for each of a plurality of I/O cells of the first memory element, the plurality of I/O cells including a first set of I/O cells and a second set of I/O cells, a first I/O cell of the first set of I/O cells being coupled with a last I/O cell of the second set of I/O cells, the scan chain portion for each I/O cell of the plurality of I/O cells including:

a first scan logic multiplexer for each of the first set of I/O cells and each of the second set of I/O cells, and an additional second scan logic multiplexer for each of the second set of I/O cells, the first scan logic multiplexer for each I/O cell having a first input coupled with an input driver, and a second input from:

a prior scan chain portion in the scan chain, wherein the second input for the first scan logic multiplexer of the last I/O cell of the second set of I/O cells is from the scan chain portion of the first I/O cell of the first set of I/O cells; or for a last I/O cell of the first set of I/O cells, a serial data input, and a single scan logic latch, wherein:

an input of the scan logic latch is coupled with an output of first scan logic multiplexer, and an output of the scan logic latch is coupled with an output driver for each of the first set of I/O cells, or is coupled with the first input of the second scan logic multiplexer for each of the second set of I/O cells;

transferring the scan data to a second memory element of the plurality of memory elements;

obtaining an output of scan data from the second memory element; and determining if the scan data input to the first memory element matches the scan data output from the second memory element, wherein a scan test is successful if the scan data input and the scan data output match.

25. The medium of claim 24, wherein the scan data is input via a serial data input of the first memory element and is output from a serial data output of the second memory element.

26. The medium of claim 24, wherein transferring the scan data from the first memory element to the second memory element includes putting the first memory element in a serial output mode and the second memory element in serial input mode.

27. The medium of claim 24, wherein transferring the scan data from the first memory element to the second memory element includes putting the first memory element in a parallel output mode and the second memory element in a parallel input mode.

\* \* \* \* \*